United States Patent
Blake

Patent Number: 6,166,816
Date of Patent: Dec. 26, 2000

[54] COMBINATION FIBER OPTIC CURRENT/VOLTAGE SENSOR

[76] Inventor: James N. Blake, 5528 E. Michelle Dr., Scottsdale, Ariz. 85254

[21] Appl. No.: 09/224,393

[22] Filed: Dec. 31, 1998

[51] Int. Cl.[7] .................................................. G01B 9/02
[52] U.S. Cl. ...................................... 356/478; 250/227.27
[58] Field of Search ........................ 356/345; 250/227.18, 250/227.19, 227.27; 385/12, 14; 324/96

[56] References Cited

U.S. PATENT DOCUMENTS

| | | | |
|---|---|---|---|
| 4,632,551 | 12/1986 | Pavlath | 356/345 |
| 5,034,679 | 7/1991 | Henderson et al. | 324/96 |
| 5,644,397 | 7/1997 | Blake | 356/345 |
| 5,696,858 | 12/1997 | Blake | 385/12 |

OTHER PUBLICATIONS

Rao et al, Spatially–multiplexed fiberoptic Bragg grating strain and temperature sensor system based on interferometric wavelength–shift detection, Electronics Letters, Jun. 1995, pp. 1009–1010.

Frosio et al, Reciprocal Reflection Interferometer for a Fiber Optic Faraday Current Sensor, Applied Optics, Sep. 1994, pp. 6111–6122.

Bohnert et al, Field Test of Interferometric Optical Fiber High–Voltage and Current Sensors, SPIE, Oct. 1994, pp. 16–19.

*Primary Examiner*—Samuel A. Turner
*Attorney, Agent, or Firm*—Robert A. Pajak

[57] ABSTRACT

A combination fiber optic current and voltage sensor having a common source and other components. One other common component for certain configurations is the detector. Voltage sources are necessarily designed to avoid coherence and intensity problems when sharing a broadband source with a current sensor. An embodiment of a combination voltage/current sensor shares a birefringence modulator, polarizer, source, detector and electronics. A multitude of fiber optic current sensors and another multitude of fiber optic voltage sensors can share a common fiber light source.

9 Claims, 5 Drawing Sheets

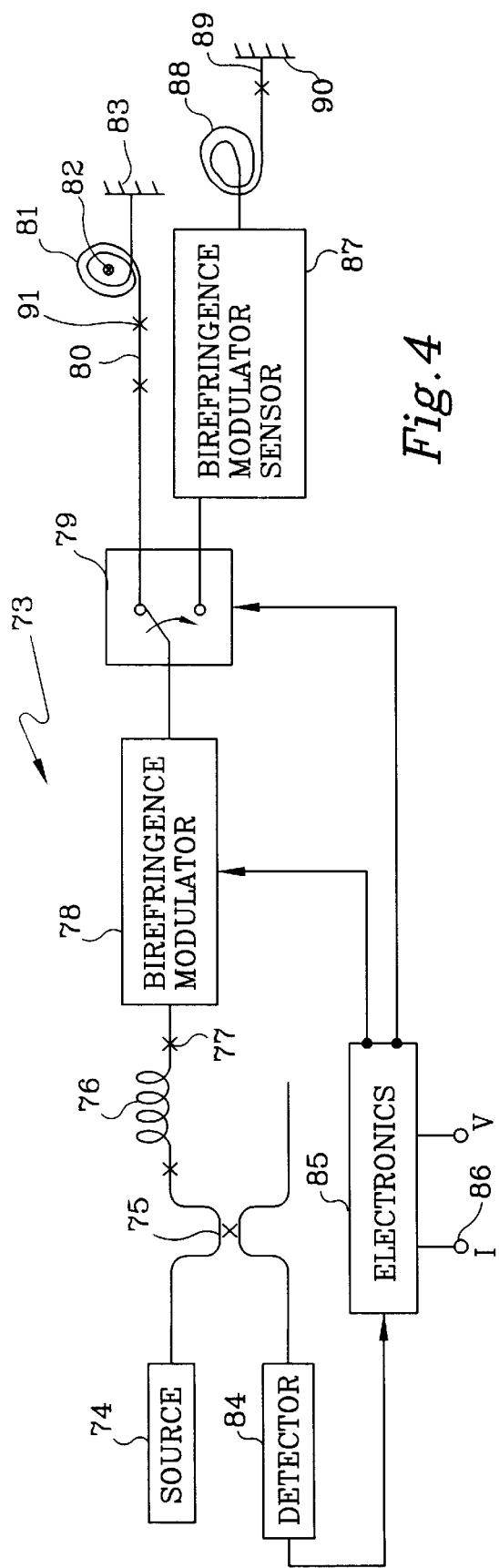
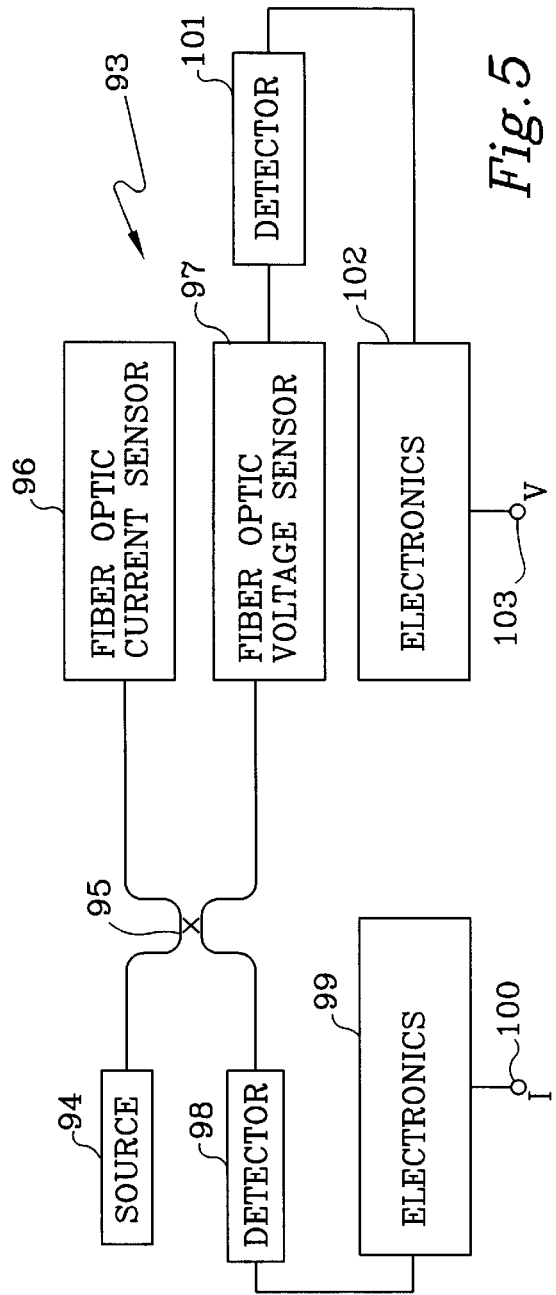
Fig. 4
Fig. 5

COMBINATION FIBER OPTIC CURRENT/VOLTAGE SENSOR

BACKGROUND

The invention pertains to fiber optic sensors and particularly to current and voltage sensors. More particularly, it pertains to a combination current and voltage sensor.

Fiber optic current and voltage sensors have been separately developed and used, since technically combining them is not straightforward. Another problem with these optical sensors is that they use costly components. A possible combining of these sensors results in the sharing of certain components, thus reducing the cost of a power measuring system.

Some of the elements of the present current sensor arrangement may utilize sensor technology from the art. Optical fiber current sensor technology is disclosed in U.S. Pat. No. 5,644,397 issued Jul. 1, 1997, to inventor James N. Blake, and entitled "Fiber Optic Interferometric Circuit and Magnetic Field Sensor", which is incorporated herein by reference. Similar technology is also disclosed in U.S. Pat. No. 5,696,858 issued Dec. 9, 1997, to inventor James N. Blake and entitled, "Fiber Optics Apparatus and Method for Accurate Current Sensing", which is incorporated herein by reference.

SUMMARY OF THE INVENTION

Components of fiber optic current and voltage sensors are costly and hinder widespread use of such sensors. The invention reveals configurations that permit the sharing of a source among numerous fiber optic current and voltage sensors combined as one sensor. Since sources are expensive, this sharing provides economic advantages. Also, a configuration for also sharing of detectors and other components among current and voltage sensors is presented.

BRIEF DESCRIPTION OF THE DRAWINGS

FIG. 4 shows fiber optic current and voltage sensors having a common source and a common detector.

FIG. 5 reveals a combination current and voltage sensor having a common source.

DESCRIPTION OF THE EMBODIMENT

Figure 1:
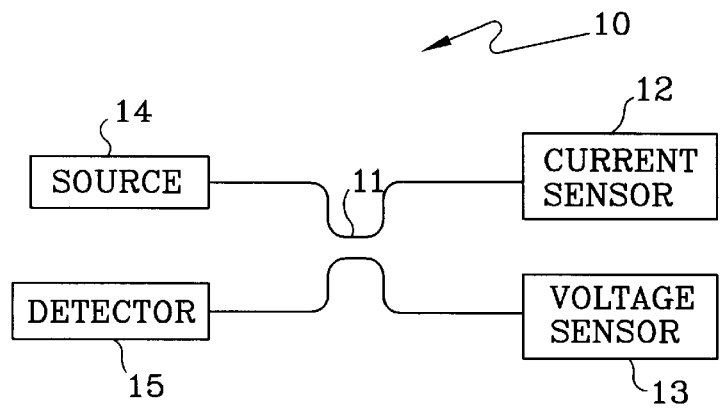
FIG. 1 is a layout of a current sensor and a voltage sensor sharing the light source, a coupler and the detector.

FIG. 1 shows the combination current and voltage sensor 10. A current sensor 12 is connected to a coupler 11 and a voltage sensor 13 is similarly connected to coupler 11. A broadband light source 14 is connected to coupler 11 for providing light to the current and voltage sensors 12 and 13. Detector 15 is connected to coupler 11 for receiving light signals from sensors 12 and 13. Either sensor 12 or 13 may be a polarimetric or interferometric type. The sensors may be Sagnac or in-line. They may involve electro-optic, electrorestrictive, and/or piezoelectric devices.

Figure 2:
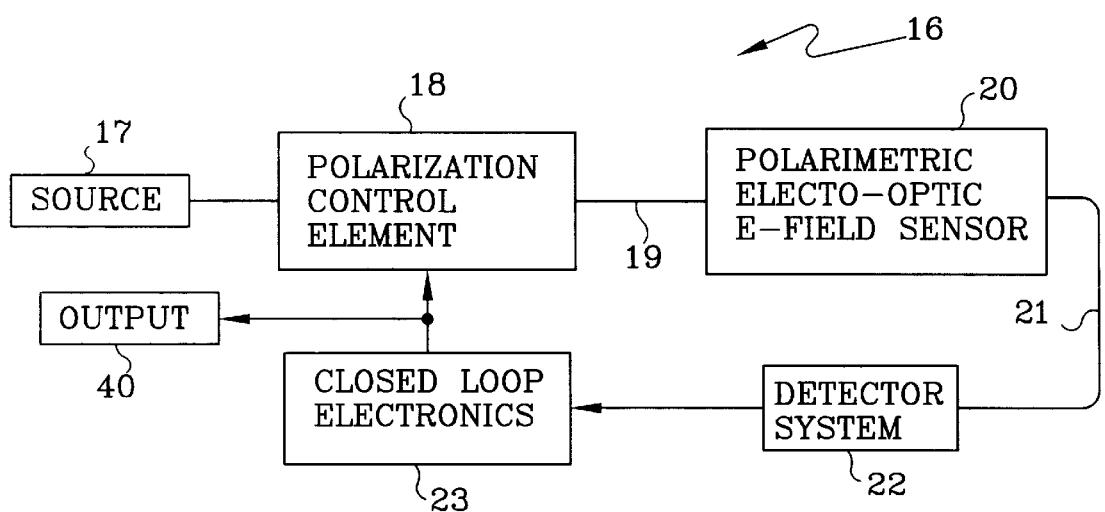
FIG. 2 shows an electro-optic voltage sensor configuration.

FIG. 2 illustrates an electro-optic voltage sensor configuration 16, which may be conveniently used in the present combined voltage/current sensor architecture. A light source 17 is connected to a polarization control element 18. Control element 18 shifts the polarization of the light entering element 18 to a stored or present polarization state. Electro-optic polarization control element 18 is used to adjust the power or intensity balance of the light between two eigen-axes of a polarization maintaining (PM) fiber 19 which goes to a polarimetric electro-optic electric field sensor 20. Sensor 20 is subjected to an electric field of the voltage to be measured. Sensing element 20 changes the power or intensity balance between the light waves or the polarization state of the light from fiber 19. Polarization-maintaining fiber 21 conveys the light from sensing element 20 to either a detector or a pair of detectors 22. The electrical output of a detector 22 goes to closed loop electronics 23. Electro-optic control element 18 receives a signal from electronics 23 which directs element 18 to restore the average power balance between the light waves in PM fiber 19. Fiber 21 brings the light from sensor 20 to detector or detectors 22 to form a closed-loop feedback system. An output 40 of system 16 receives the loop-closing signal from electronics 23. The loop-closing signal, which is applied to electro-optic polarization control element 18, restores the polarization state of the light in fiber 21 to a normal state. Control element 18 and sensor 20 have equal and opposite voltage signals, i.e., the feedback signal and the sensed voltage, applied to the two elements 18 and 20, respectively. Detector system 22 may have one detector detecting light of one polarization state and another detector detecting light of the other polarization state. The directing of the light of a certain polarization to the respective detector may be accomplished with a polarization sensitive light splitter. The average value of the difference of the intensities (i.e., $I_1-I_2$) is held to zero. There is a dither of the polarization state having a first harmonic in the loop.

Figure 3:
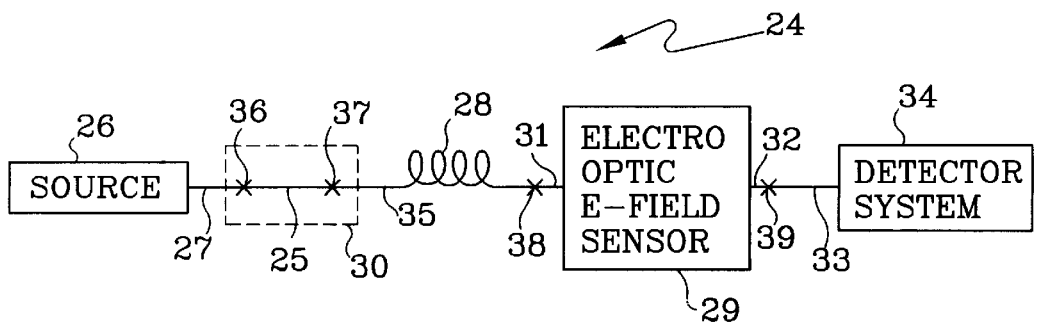
FIG. 3 illustrates the addition of an optical delay in a path of the voltage sensor.

FIG. 3 illustrates a voltage sensor 16 having an optical delay element 30 in the voltage sensor 16 path. A light source 26 is connected to a portion 27 of birefringent or polarization maintaining (PM) fiber. A certain length of PM fiber 25 is connected to PM fiber 27. The polarization eigen-axes of PM fibers 25 and 27 are aligned at angle at splice 36. Fiber 35 is also connected to polarizer 28 or may be part of the polarizing fiber that constitutes the polarizer. Fiber 25 and fiber 28 are connected together with eigen-axes aligned at angle of splice 37. Electro-optic electric-field sensor 29 has a PM input fiber 31 with polarization eigen-axes and an output PM fiber 32 likewise with axes. Input fiber 31 is connected to polarizer 28 with birefringence axes having a mutual 45-degree alignment at splice 38. Output fiber 32 is connected to a PM fiber 33 with their axes having a 45-degree alignment at splice 39. A delay between two polarization states of light in the eigen-axes of PM fiber 25 from splice 36 to splice 37, is inserted in the optical path of device 24, to give a coherence peak in that delay. There also is a delay in an electro-optic electric field sensor 29 between splices 38 and 39. $\tau_1$ equals $\tau_2$ so that a coherent interference exists between the two paths of sensor 24. This coherent interference takes place even with broadband light from source 26. The delay or of fiber 25 is substantially equal to the relative delay between the two arms of the sensing paths (preferably polarization mode paths) in electric field sensing element 29. This permits the use of a common broadband source 26 for both current and voltage sensing. The light from sensor 29 goes via PM fiber 33 to detector system 34 which determines the voltage via the electric field sensed by sensor 29, by discriminating the difference of intensities of light of two polarizations in the two eigen axes of fiber 33.

FIG. 4 shows a combination current/voltage sensor 73. Both current and voltage portions of sensor 73 use a common source 74 and detector 84. Source 74 emits light that goes through coupler 75 onto a polarizer 76. Polarizer 76 is connected to birefringence modulator 78 with a 45-degree splice 77. The light goes through splice 77 onto birefringence modulator 78. From modulator 78, the light goes to an optical switch 79 or other like capable device. Optical switch 79 selects a current or voltage sensor mode. In the current mode, as shown, the light goes on through a mode converter 80 to current sensing fiber 81. The light in fiber 81 is affected by a current flowing through wire 82. After the light traverses fiber 81, it is reflected by reflective termination 83 at the end of fiber 81. The light retraces its path back to coupler 75. Coupler 75 channels at least a portion of the light of detector 84. Detector 84 converts the light signal to a representative electrical signal that goes to electronics 85. Electronics 85, in a closed loop fashion, provides a feedback signal to birefringence modulator 78. Also, a current magnitude indication is provided at output 86. Also, electronics 85 selects the current or voltage-measuring mode with a signal to optical switch 79. The selection of the mode may be periodic, selected or dependent on some special input to electronics 85.

Assuming optical switch 79 to be in the voltage sensor mode (other than the one shown in FIG. 4), the light goes from birefringence modulator 78 through optical switch 79 to a birefringence modulator sensor 87. Sensor 87 is sensitive to the electric field of the voltage being measured, and thus affects the light going through sensor 87. The light goes on through delay line 88. Delay line 88 is terminated with a quarter-wave plate 89 and reflective device 90. Splice 91 provides a 45-degree alignment of axes. The light is reflected back. The light retraces its path back to coupler 75. Coupler 75 channels at least a portion of the light to detector 84. Detector 84 converts the light signal to a representative electrical signal that goes to electronics 85. Electronics, in a closed-loop fashion, provides a feedback signal to birefringence modulator 78. Also, a voltage magnitude indication is provided at output 92. Outputs 86 and 92 may also provide current direction and voltage polarity, respectively.

FIG. 5 reveals a configuration 93 of the fiber optic combination current/voltage sensor. Both the current and voltage sensors have a common source 94. Light from source 94 goes through coupler or splitter 95. Light from coupler 95 goes to fiber optic current sensor 96 and fiber optic voltage sensor 97. The light affected by a current returns from sensor 96 through coupler 95 to detector 98 which converts the light into a representative electrical signal. The electrical signal is processed by electronics 99 to provide a current magnitude indication at output 100. The light affected by a voltage goes on to detector 101. Detector 101 converts the affected light into a representative electrical signal that goes to electronics 102. Electronics 102 processes the signal into a voltage magnitude indication provided at output 103. Outputs 100 and 103 may also provide current direction and voltage polarity, respectively.

Figure 6:
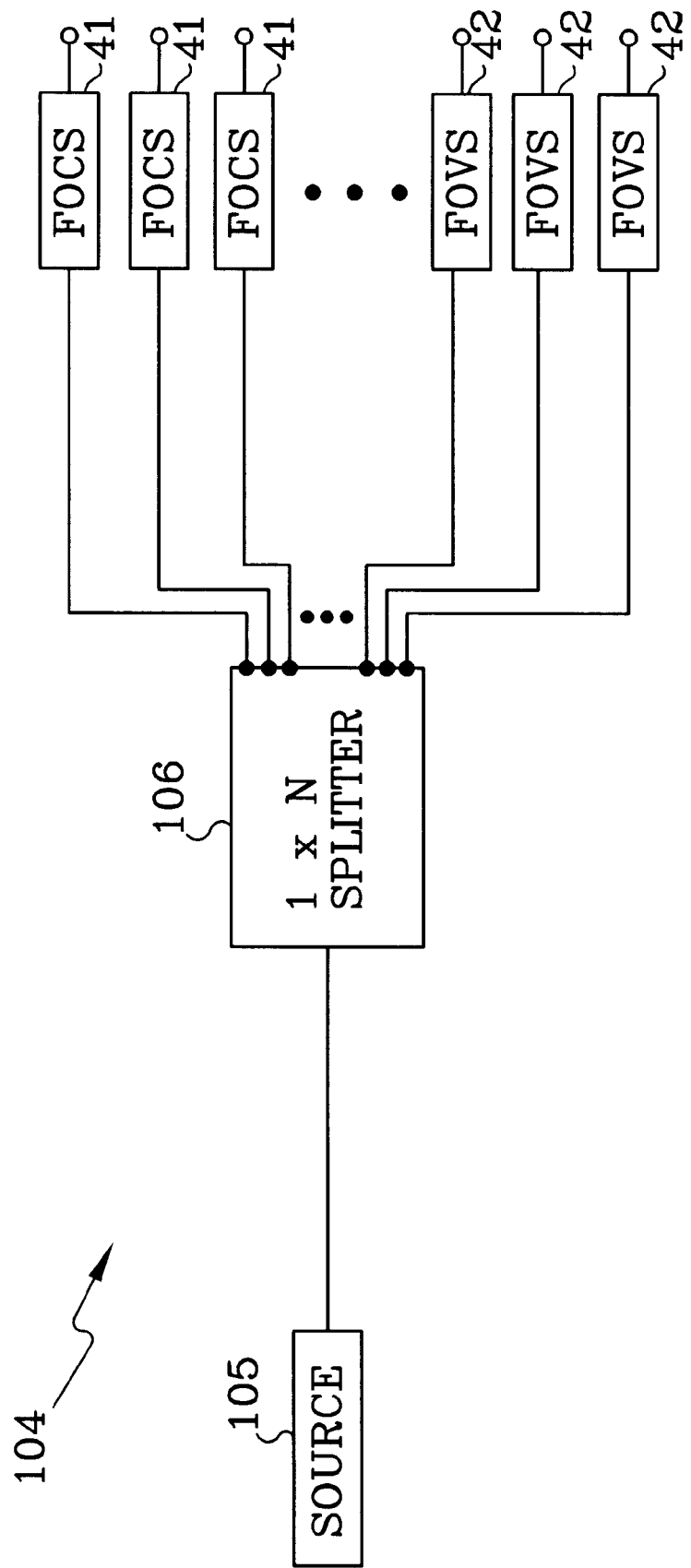
FIG. 6 shows a configuration with one source for a plurality of current and voltage sensors.

FIG. 6 shows a configuration 104 that has a common source 105 for a plurality of or numerous current sensors (FOCS) 41 and fiber optic voltage sensors (FOVS) 42. Instances of a FOCS 41 and a FOVS 42 are described below in conjunction with FIGS. 7 and 8, respectively. Light from source 105, which is preferably a fiber light source, goes to a 1×N splitter 106, "N" being the number of outputs of splitter 106. Splitter 106 may be constructed in various ways. For example, one is an N splitter; and another is a series of 1×2, 1×3 or 1×4 splitters connected together so as to get the one input to N outputs. Each of these outputs is connected to a FOCS 41 or a FOVS 42.

Figure 7:
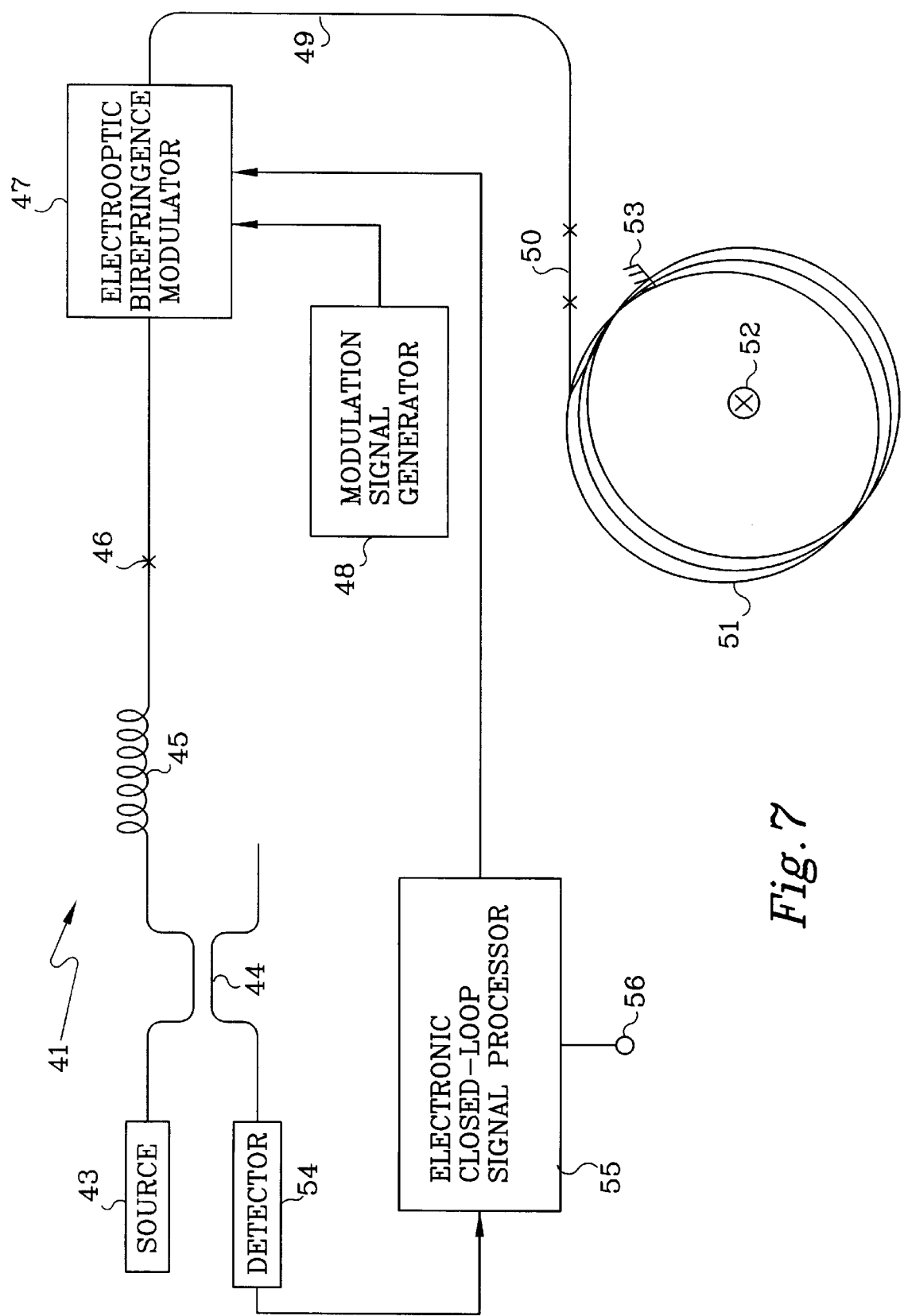
FIG. 7 illustrates a fiber optic current sensor.

FIG. 7 shows a fiber optic current sensor (FOCS) 41. Light from source 43 propagates through coupler 44 and polarizer 45 to a 45-degree splice 46, where it divides equally into the two polarization states maintained throughout the rest of the optical circuit. Electro-optic birefringence modulator 47 differentially modulates the phases of the light in the two polarization states. Modulator 47 is driven by a modulation signal generator 48 that provides an electrical, periodic, alternating signal having either a square or sine wave. The light then propagates through delay line 49, through mode converter 50 which converts the two linear states of polarization into two circular states of polarization, and through sensor coil 51. Sensor coil 51 is wound around current carrying wire 52. The light reflects off reflective termination 53 and retraces its way through the optical circuit, finally arriving at detector 54. Closed-loop signal processor 55 converts the detected signal to a feedback signal, which goes to modulator 47. Also, processor 55 outputs a signal 56 indicative of the amount of current flowing in current carrying wire 52.

Figure 8:
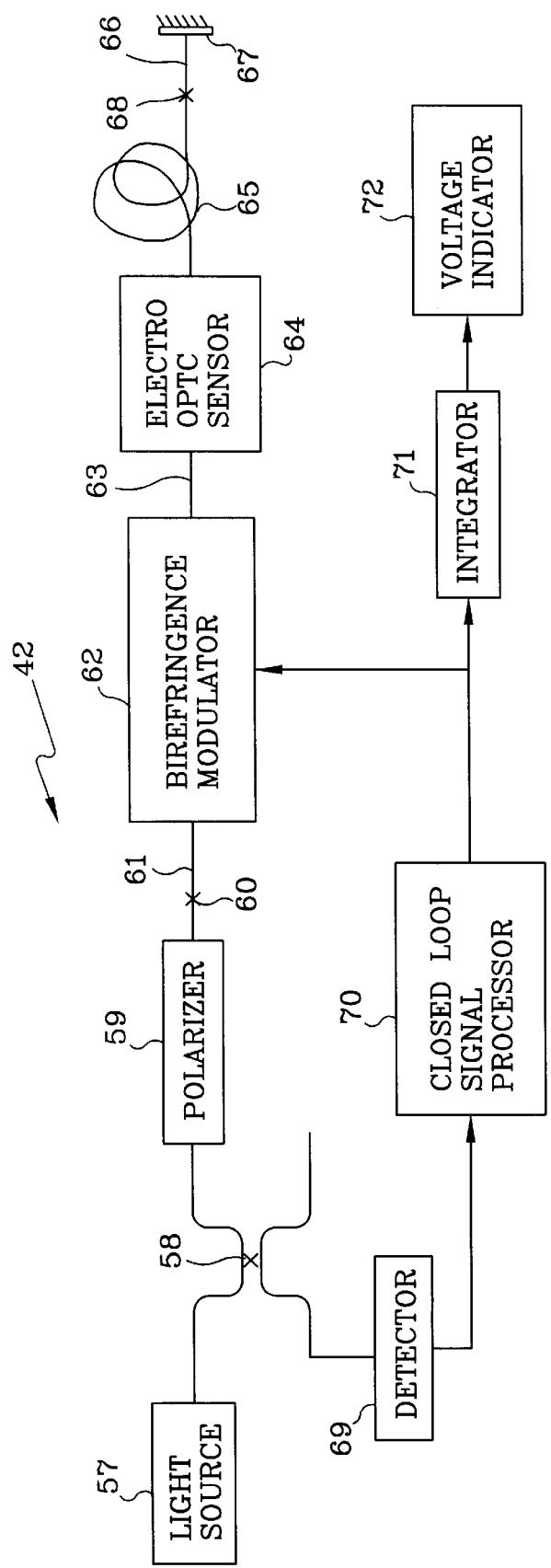
FIG. 8 illustrates a fiber optic voltage sensor.

FIG. 8 shows a fiber optic voltage sensor (FOVS) 42 having a dynamic phase shift between the polarizations of light. It is a closed-loop system. A light source 57 emits light that goes through coupler 58 and onto polarizer 59. The output fiber of polarizer 59 is connected with a splice 60 to a polarization-maintaining (PM) input fiber 61 of birefringence modulator 62. The axes of connection 60 are aligned at 45 degrees to distribute the light evenly in both polarization axes of PM fiber 61. Light travels through modulator 62 in both polarization axes and down a PM fiber 63 to an electro-optic (i.e., electric field) sensitive element 64. Modulator 62 provides a bias modulation of the birefringence between the two axes of polarization of light medium in modulator 62. The bias modulation occurs at a frequency of about several hundred kilohertz (for example, 300 kHz). Electro-optic sensor 64 provides additional birefringence modulation at about 60 hertz, since the voltage being measured would be that of a 60 hertz power line. The electric field, say, from the voltage being monitored, modulates the birefringence between the two light waves in sensor 64. The light from sensor 64, enters a PM fiber delay line 65, which has axes aligned with sensor 64, and is connected to and terminated by a quarter-wave plate or PM fiber 66 and a mirror 67, via connection 68, such that light traveling down fibers 65 and 66 in the x-axis returns in the y-axis and vice versa. The axes of delay line 65 and termination 66 are at a 45-degree alignment at connection 68. The light returns from fiber 65 to sensor 64 and receives further birefringence modulation. The two portions of the light entering fiber 66 in the first (x) and second (y) polarizations, respectively, return from fiber 66 in the other polarizations, that is, in the second (y) and first (x) polarizations, respectively. The birefringence modulation on the two waves is not canceled for AC (i.e., alternating current) fields because of the delay time between the passage of the two waves through sensor 64. The light then travels from sensor 64 through fiber 63, modulator 62, fiber 61, polarizer 59 and coupler 58 to detector 69.

The output of detector 69 is an electrical representation of the light waves entering the detector. The AC fields detected are typically of a low frequency compared to the delay time introduced by delay line 65 between sensing element 64 and mirror 67. In this case, the non-reciprocal phase shift introduced is proportional to the time derivative of the field to be sensed. Closed-loop signal processing electronics 70 may be incorporated to take in the signal from detector 69 and provide a feedback signal to birefringence modulator 62. This signal has a non-reciprocal phase-shift, as noted above, which is proportional to the time derivative of the field to be sensed. Thus, the signal may be integrated by integrator 71 to yield an output proportional to the field of the voltage sensed by the element 64. The output signal from integrator 71 goes to a voltage indicator 72, which provides the voltage reading of measuring device 42 with respect to the voltage being measured at sensor 64.

I claim:

1. A combination fiber optic current and voltage sensing system comprising:
 a light source for generating a first light wave;
 an optical coupler connected to said light source, said coupler having,
  at least one input for receiving an input light wave derived from said first light wave,
  a first input/output terminating end for passing light in opposite directions therethrough, said first input/output terminating end outputting a first portion of said input light wave, and,
  a second input/output terminating end for passing light in opposite directions therethrough, said second input/output terminating end outputting a second portion of said input light wave, and
  a third input/output terminating end for outputting a portion of any light impinging upon said first and second input/output terminating ends;
 an optical current sensor coupled to said coupler for receiving light derived from said first portion of said input light wave, and;
 an optical voltage sensor coupled to said coupler for receiving light derived from said second portion of said input light wave.

2. The combination fiber optic current and voltage sensing system of claim 1, further comprising a detector coupled to said third input/output terminating end for receiving a portion of any light passing out of said third input/output terminating end.

3. The combination fiber optic current and voltage sensing system of claim 2, wherein said light source is a fiber light source.

4. The fiber optic sensing system of claim 1 wherein said voltage sensor comprises:
 a polarization control element coupled to said coupler for receiving light emanating from said second input/output terminating end;
 an electro-optic sensor connected to said polarization control element for sensing an external voltage;
 a detector connected to said electro-optic sensor; and
 a processor connected to said detector and to said polarization control element for providing an output indicative of any voltage sensed by said electro-optic sensor.

5. The fiber optic sensing system of claim 1 wherein said voltage sensor comprises:
 an optical delay line coupled to said coupler for receiving light emanating from said second input/output terminating end;
 a polarizer connected to said optical delay line;
 an electro-optic sensor connected to said polarizer for sensing an external voltage; and
 a detector connected to said electro-optic sensor for providing an output indicative of any voltage sensed by said electro-optic sensor.

6. The combination fiber optic current and voltage sensing system of claim 1 wherein said voltage sensor comprises:
 a delay line coupled to said coupler, said delay line having a first terminating end for receiving light emanating from said second input/output terminating end, and a second terminating end for passing light therethrough;
 a polarizer coupled to said delay line for receiving light emanating from said second terminating end of said delay line;
 an electro-optic sensor connected to said polarizer for sensing an external voltage;
 a detector means connected to said electro-optic sensor for providing for providing an output indicative of any voltage sensed by said electro-optic sensor.

7. A combination fiber optic current and voltage sensing system comprising:
 a light source for generating a first light wave;
 an optical coupler connected to said light source, said coupler having,
  at least one input for receiving an input light wave derived from said first light wave,
  a first input/output terminating end for passing light in opposite directions therethrough, said first input/output terminating end outputting a first portion of said input light wave, and,
  a second input/output terminating end for passing light in opposite directions therethrough, said second input/output terminating end outputting a second portion of said input light wave, and
  a third input/output terminating end for outputting a portion of any light impinging upon said first and second input/output terminating ends;
 a fiber optic current sensor coupled to said coupler for receiving a first sensing light wave derived from said first portion of said input light wave, said fiber optic current sensor including means for affecting said first sensing light wave in response to a current intended to be measured, and outputting a second sensing current indicative thereof, and directing said second sensing current to impinge upon said first input/output terminating end;
 an optical voltage sensor coupled to said coupler for receiving light derived from said second portion of said input light wave; and
 a detector coupled to said third input/output terminating end for receiving a portion of any light passing out of said third input/output terminating end.

8. A combination fiber optic current and voltage sensing system comprising:
 a light source for emitting a first light wave;
 an optical coupler connected to said light source, said coupler having,
  at least one input for receiving an input light wave derived from said first light wave,
  a first input/output terminating end for passing light in opposite directions therethrough, said first input/output terminating end outputting a first portion of said input light wave, and,
  a second input/output terminating end for passing light in opposite directions therethrough, said second input/output terminating end outputting a second portion of said input light wave, and
  a third input/output terminating end for outputting a portion of any light impinging upon said first and second input/output terminating ends;

a polarizer for receiving said first portion of said input light wave, said polarizer having an input terminating end and an output terminating end for passing light waves in opposite directions therethrough;

a birefringence modulator having first and second terminating ends capable of passing light waves in opposite directions therethrough, said first terminating end thereof coupled to said polarizer second terminating end;

an optical switch having first terminating end coupled to said second terminating end of said birefringence modulator, and second and third terminating ends, said optical switch capable of selectively coupling said first terminating end to one of said second and third terminating ends thereof;

an inline fiber optic current sensor having a first terminating end coupled to second terminating end of said optical switch, said inline optical current sensor including a current sensing fiber terminated at one end thereof by a reflective termination so as reflect light exiting from said current sensing fiber to pass through said sensing fiber in an opposite direction, and successively pass through said optical switch from said third terminating end to said first terminating end thereof;

an optical voltage sensor coupled to said third terminating end of said optical switch for receiving light therefrom; and a detector coupled to said third input/output terminating end for receiving a portion of any light passing out of said third input/output terminating end.

9. The combination fiber optic current and voltage sensing system of claim 8 wherein said coupler is a beam splitter.

* * * * *